United States Patent [19]

Nouailhat et al.

[11] Patent Number: 5,298,779
[45] Date of Patent: Mar. 29, 1994

[54] COLLECTOR OF A BIPOLAR TRANSISTOR COMPATIBLE WITH MOS TECHNOLOGY

[75] Inventors: Alain Nouailhat, Meylan; Daniel Bois, Saint Ismier, both of France

[73] Assignee: France Telecom-Establissement Autonome de Droit Public, France

[21] Appl. No.: 836,248

[22] Filed: Feb. 18, 1992

[30] Foreign Application Priority Data

Feb. 18, 1991 [FR] France .................. 91 01984

[51] Int. Cl.$^5$ .................. H01L 27/02; H01L 29/04
[52] U.S. Cl. .................. 257/273; 257/378; 257/518; 257/588; 257/755
[58] Field of Search ........ 257/273, 370, 378, 382, 257/518, 520, 554, 588, 754, 755

[56] References Cited

U.S. PATENT DOCUMENTS

| | | | |
|---|---|---|---|
| 4,665,424 | 5/1987 | Hirao | 257/755 |
| 4,782,030 | 11/1988 | Katsumata et al. | 257/588 |
| 4,835,596 | 5/1989 | Werner | 257/273 |
| 4,980,304 | 12/1990 | Chin et al. | 257/754 |
| 5,065,209 | 11/1991 | Spratt et al. | 257/588 |

FOREIGN PATENT DOCUMENTS

| | | |
|---|---|---|
| 0201867 | 11/1986 | European Pat. Off. |
| 0303435 | 2/1989 | European Pat. Off. |
| 0337720 | 10/1989 | European Pat. Off. |
| 61-074363 | 4/1986 | Japan .................. 257/755 |
| 267732 | 3/1990 | Japan .................. 257/588 |

OTHER PUBLICATIONS

IEEE Transactions On Electron Devices, vol. 33, No. 3, Mar. 1986, New York, pp. 345-353; Fang-Shi J. Lai: "Design and Characteristics of a Lightly Doped Drain (LDD) Device Fabricated with Self-Aligned Titanium Disilicide".

*Primary Examiner*—Rolf Hille
*Assistant Examiner*—Mahshid Saadat
*Attorney, Agent, or Firm*—Bacon & Thomas

[57] ABSTRACT

A bipolar transistor comprising a semiconductor substrate, of a first conductivity type, a retrograde well serving as the collector and having a second conductivity type opposite to the first, a base active region having a first conductivity type, a region serving as an emitter of the second conductivity type, the regions being bordered on either side by insulating regions. According to the invention, the transistor includes at least one second conductivity type zone serving as the collector contact, located in a region of the retrograde well at a distance from the base zone and extending away from said base zone no further than level with the insulating zone. The invention is applicable to making BI-MOS or BI-CMOS circuits.

4 Claims, 5 Drawing Sheets

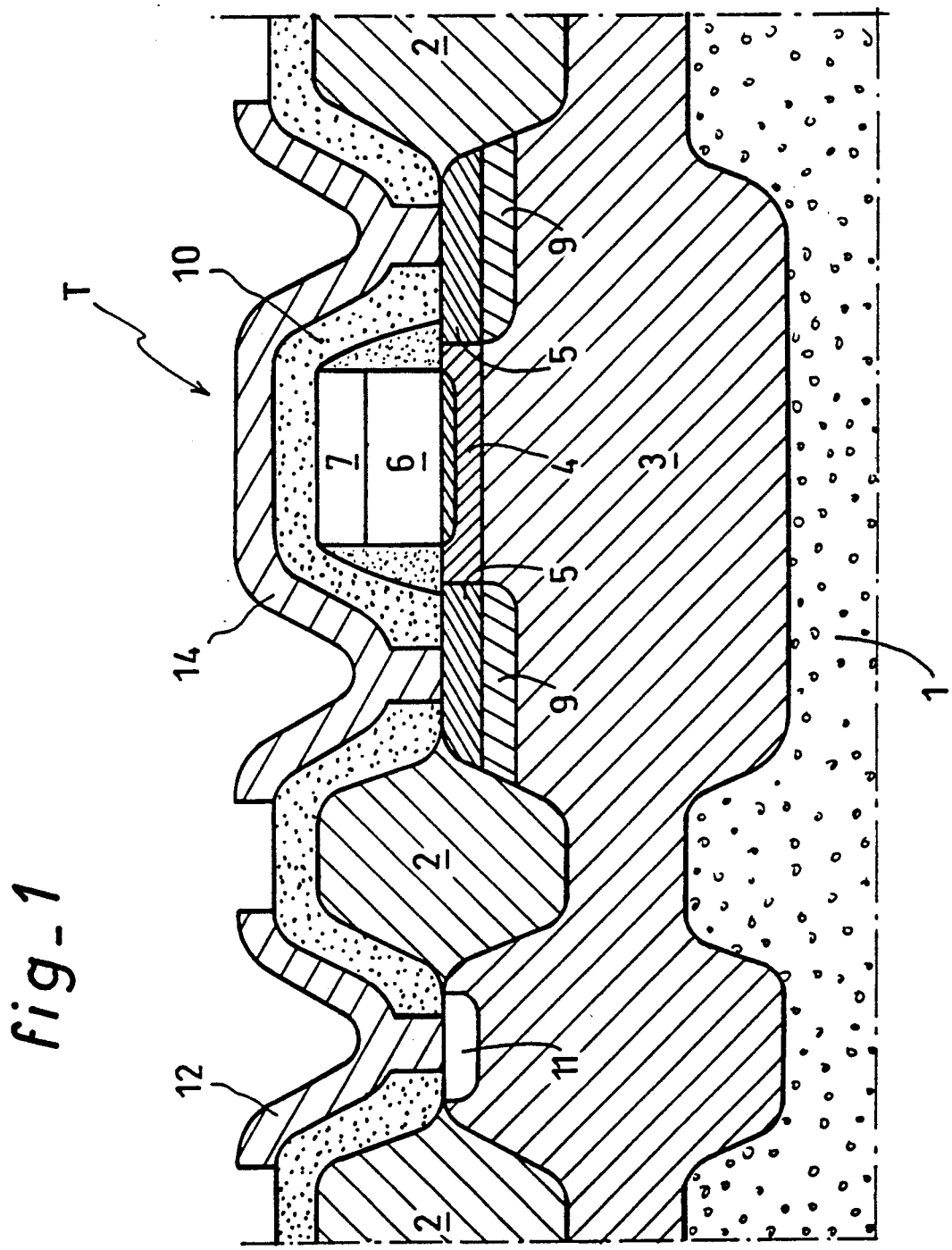
fig_1

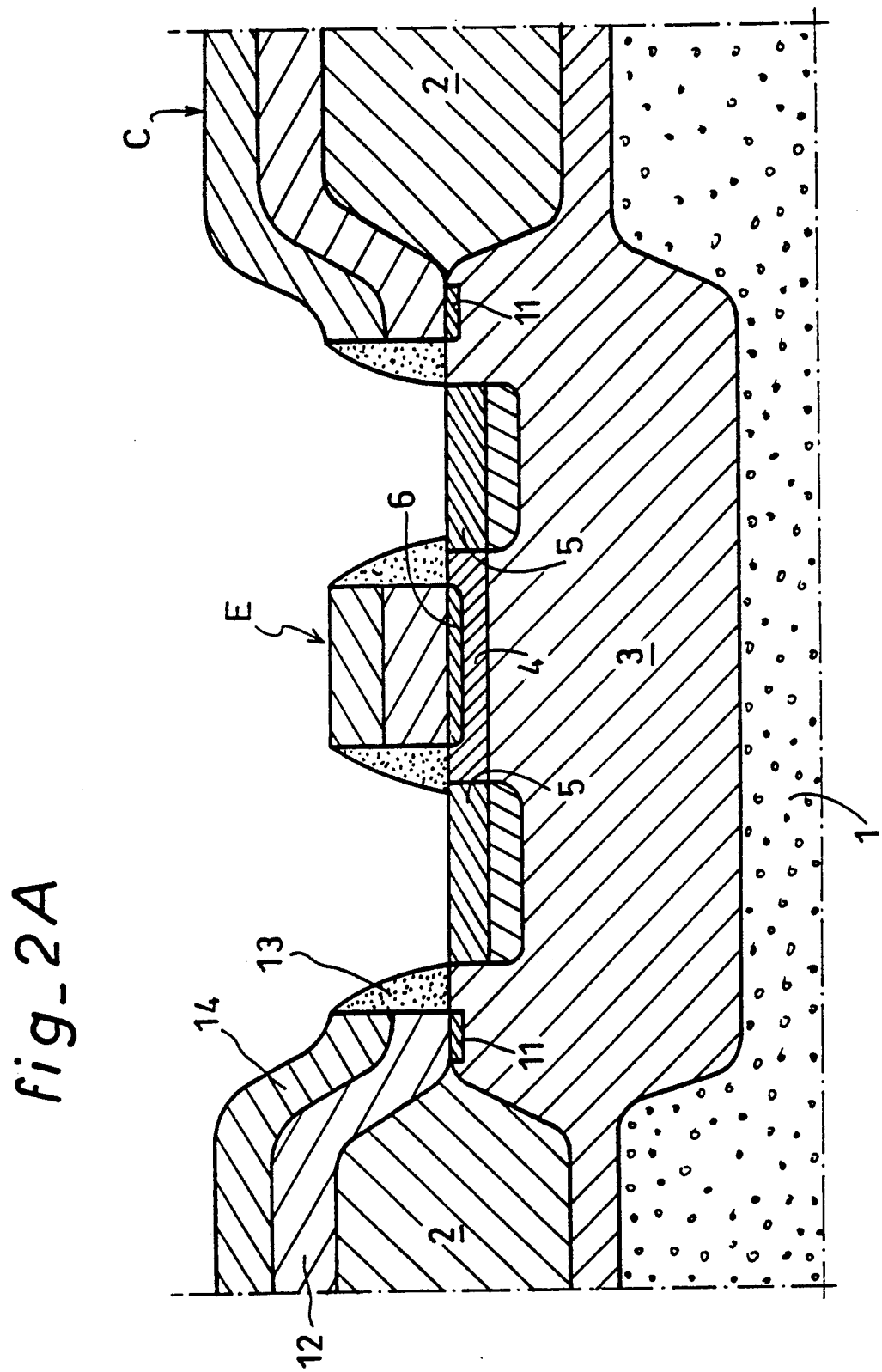
fig_2A

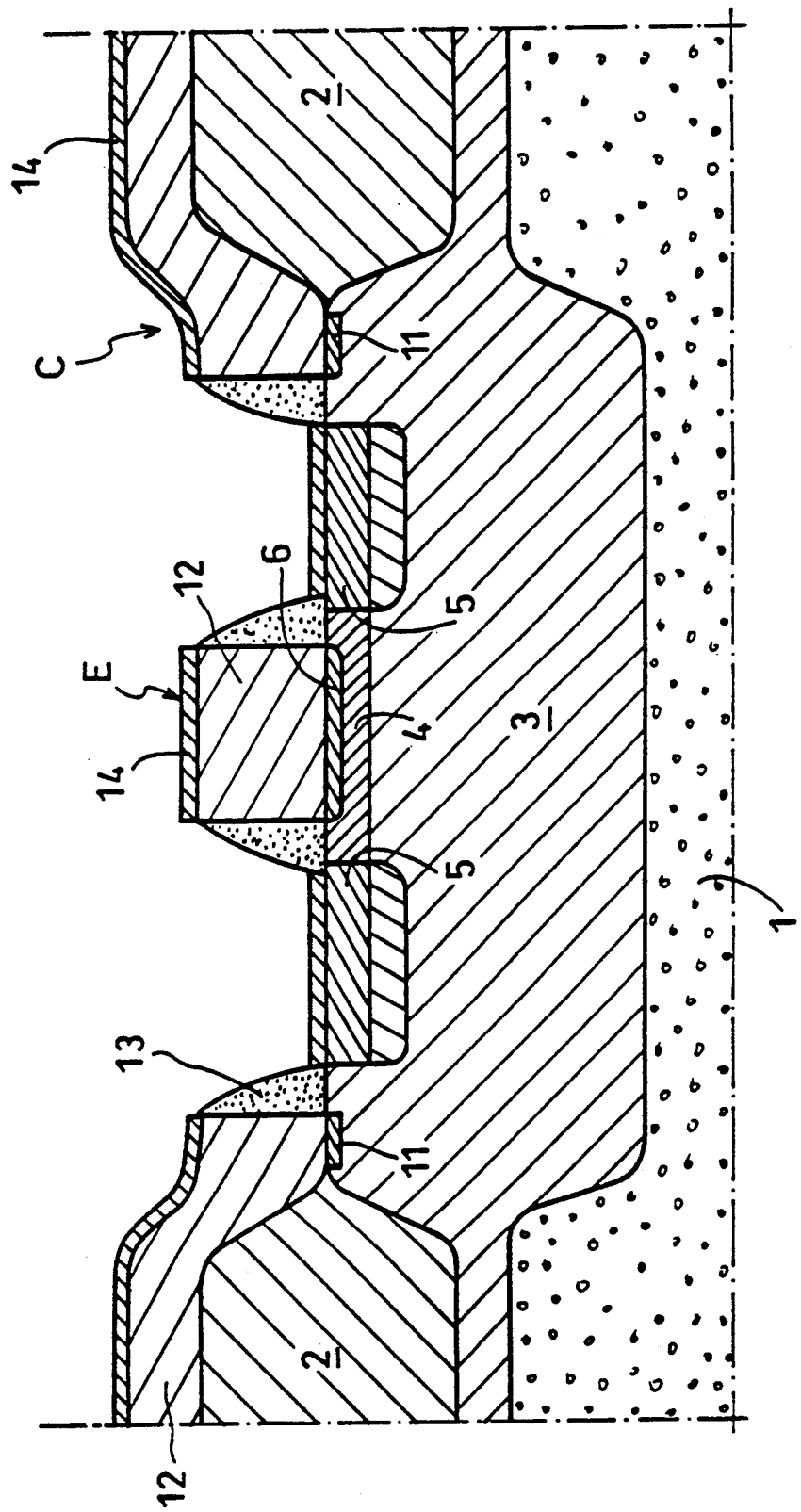
fig_2B

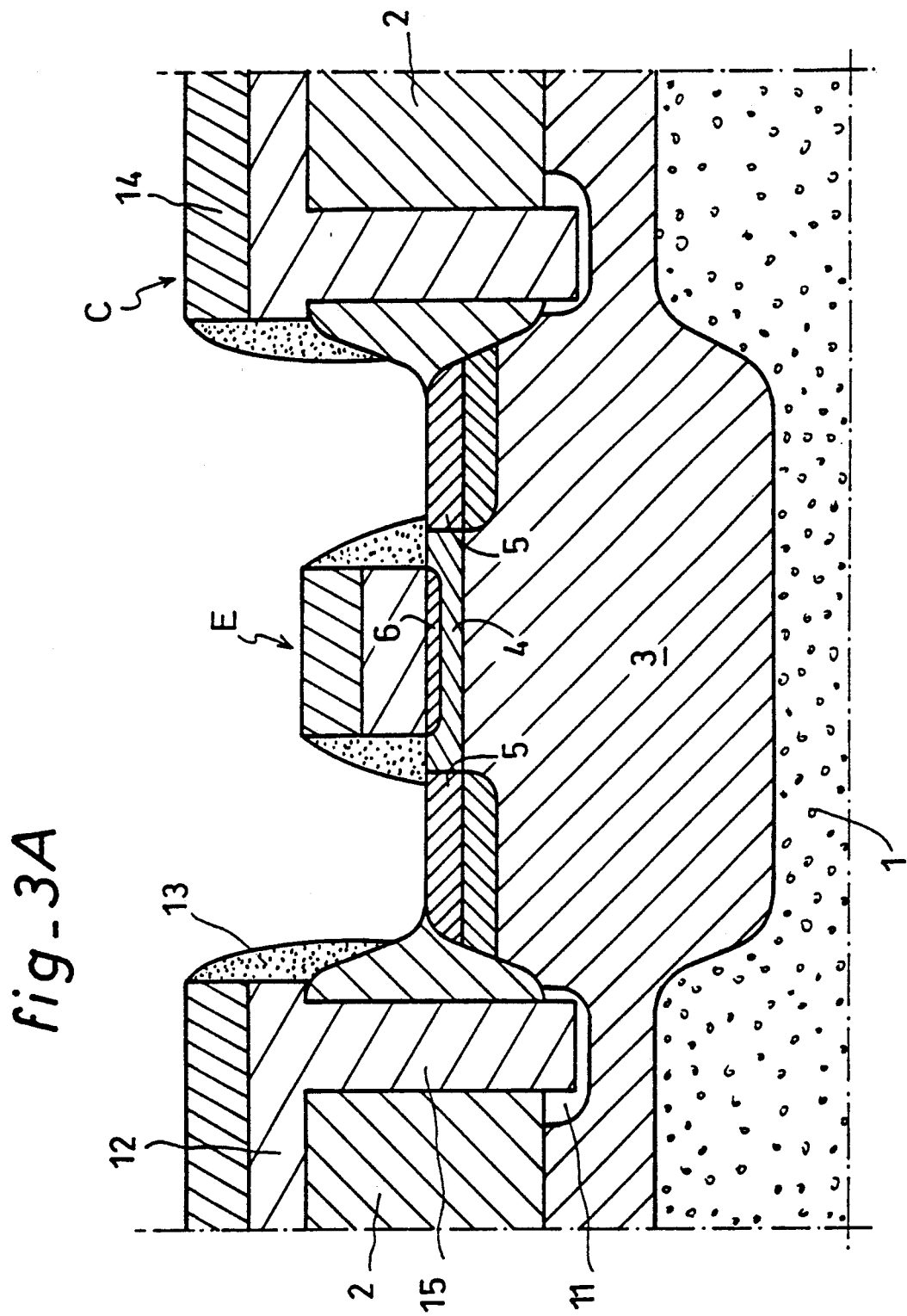
fig_3A

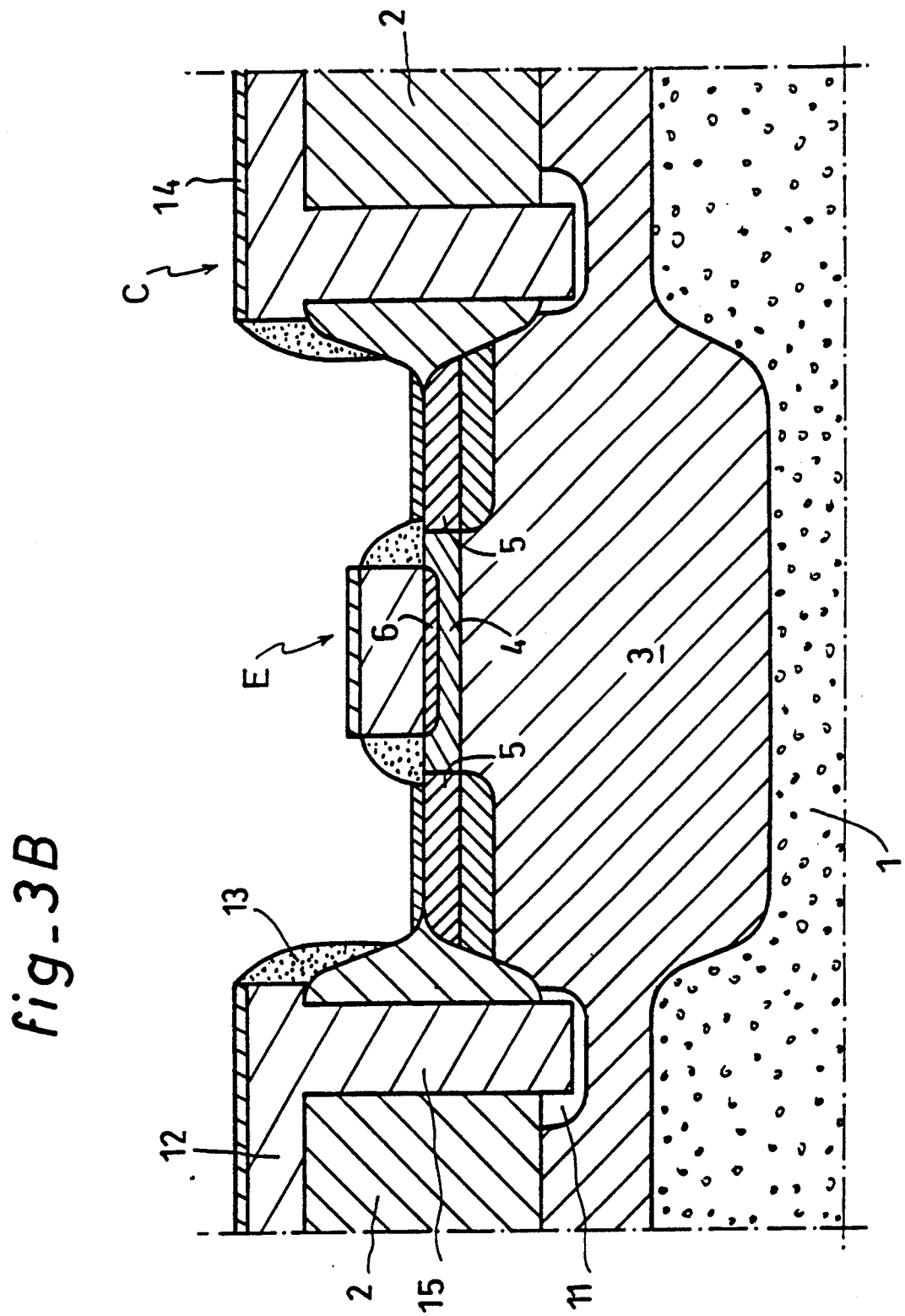
fig_3B

COLLECTOR OF A BIPOLAR TRANSISTOR COMPATIBLE WITH MOS TECHNOLOGY

The present invention relates to the general technical field of making a bipolar transistor that is compatible with MOS technology and advantageously implementing a retrograde well.

More particularly, the invention relates to improving the collector of such a bipolar transistor.

BACKGROUND OF THE INVENTION

In the prior art, French patent application No. 2 626 406 proposes a bipolar transistor which is compatible with MOS technology. As can be seen more clearly in FIG. 1, the bipolar transistor T is made on a semiconductor substrate 1 having a first conductivity type, e.g. P type. Starting from a main face of the substrate 1, the following are formed: firstly lateral insulating zones, thick partitions, or thick oxide zones 2 by the conventional local oxidation of silicon (LOCOS) technique, and secondly an active transistor junction region 3 constituted by a retrograde well making it possible to obtain high concentrations at depth by deep implantation in conventional manner. The retrograde well 3 which acts as a collector possesses a second conductivity type opposite to the first, namely N type in the chosen preferred example.

A base active region 4 having P-type conductivity and disposed between base contact regions 5 on either side thereof is installed in a surface plane of the collector region 3 between two insulating zones 2. The regions 5 are highly doped on the surface after the emitter and spacers have been formed as described below so as to form base contact regions of very low resistivity referred to as extrinsic base regions 9.

An active emitter region 6 of the N+ type is formed to cover substantially the same face of the substrate over the base region 4. The emitter region 6 is covered by an emitter contact region 7 made of tungsten silicide WSl$_2$. An insulating layer 10 of silicon oxide is then deposited on the main face of the substrate and windows are formed therein by local photo-etching so as to give access to the base contact regions 5 and so as to implant a collector contact region 11 of the N+ type formed between two insulating zones 2. Metallization is then performed to obtain metallic contacts 12 and 14 through the windows, respectively for the collector (contact 12) and for the base (contact 14).

Such a transistor whose structure is self-aligned at emitter-base level serves to improve the emitter-base system at high current densities. Although such a structure provides undeniable advantages over the state of the art, it should nevertheless be understood that this transistor has high collector resistance. In addition, forming a surface collector contact gives rise to additional unwanted resistance.

The present invention therefore seeks to propose a bipolar transistor which is compatible with MOS technology and whose collector resistance is considerably improved compared with the known solutions in the state of the art.

SUMMARY OF THE INVENTION

To achieve this object, the bipolar transistor comprises a semiconductor substrate, of a first conductivity type, a retrograde well serving as the collector and having a second conductivity type opposite to the first, a base active region having a first conductivity type, a region serving as an emitter of the second conductivity type, the regions being bordered on either side by insulating regions.

According to the invention, the bipolar transistor includes at least one second conductivity type zone serving as the collector contact, located in a region of the retrograde well at a distance from the base zone and extending away from said base zone no further than level with the insulating zone.

In a first embodiment, each zone serving as a collector contact is made at the edge of an insulating zone beside the base region.

To further improve the collector contact, each zone serving as a collector contact may be formed substantially level with an insulating zone and may be in contact with a trench crossing right through the insulating zone.

BRIEF DESCRIPTION OF THE DRAWINGS

Embodiments of the invention are described by way of example with reference to the accompanying drawings, in which:

FIG. 1 is a diagrammatic section view through a state of the art NPN bipolar transistor of the WSi$_2$ polycide type.

FIG. 2A is a diagrammatic section view through a variant embodiment of the invention showing a collector of a bipolar transistor using the polycide technique.

FIG. 2B is a view of the first embodiment of a bipolar transistor collector using the salicide technique.

FIG. 3A is a diagrammatic section view through a second embodiment of the invention comprising a bipolar transistor collector using the polycide technique.

FIG. 3B is a view of the second embodiment of a bipolar transistor collector using the salicide technique.

DETAILED DESCRIPTION

FIG. 2A shows an embodiment of a bipolar transistor compatible with MOS technology and whose main characteristics are implemented using the technique described in French patent application No. 2 626 406. The bipolar transistor is made on a semiconductor substrate 1 having a first conductivity type, e.g. P-type conductivity. Insulating zones 2 are implanted on a main face of the substrate 1 using the conventional local oxidation of silicon (LOCOS) technique. The substrate also has a region 3 constituted by a retrograde well for enclosing the active zone of the NPN junction of the transistor. The retrograde well 3 which serves as the collector has a second type of conductivity opposite to the first, i.e. it is of N-type conductivity in the chosen preferred example. A P-type active base region 4 is implanted in the well 3 and is extended laterally on either side by extrinsic base contact regions 5 which are self-aligned relative to the emitter.

According to the invention, provision is made for making at lest one, and in the example shown two, N+ type zones 11 insulating zones 2, beside the base regions and spaced apart therefrom.

FIG. 2A shows a first embodiment of collector contact zones 11 made by the known technique of the polycide type. In that technique, a complex silicide coating is formed on the face of the substrate by depositing a layer of polysilicon 12 which is covered by a layer of silicide or of metal 14 which is subsequently subjected to annealing. Such a containing 12, 14 of polysilicon and of silicide is subsequently removed by masking and photo-etching except, firstly in an emitter contact region E forming an active emitter region 6 made level with the base active region 4 and obtained by diffusion, and secondly in regions extending over the insulating zones 2 and beside the base regions. These regions 11 are obtained by diffusion into the well 3 from the layer 12 and constitute the collector contact zones.

The remaining portions of the coating 12, 14 thus constitute collector or emitter contacts C or E. In conventional manner, insulating spacers 13 are formed on the side edges of the collector and emitter contacts C and E extending between the collector contact zones 11 and the extrinsic base zones 5.

By making collector contact zones 11 level with the insulating zones 2 it is possible to reduce the collector resistance insofar as the contact zone 11 is as close as possible to the extrinsic base region 5. The collector contact zones 11 are advantageously obtained by diffusion, simultaneously with making the emitter active region 6 which is likewise obtained by diffusing dopants from the layer 12.

FIG. 2B shows how collector contact zones 11 can be made using the known salicide type technique (self-aligned silicide). In that technique, a layer of polysilicon 12 is deposited on the face of the substrate after the zones 2, 3, 4, and 5 have been made, which layer 12 is subsequently removed by masking and photo-etching with the exception of the emitter active region 6 and of the collector contact zones 11, as described for the above technique. After the insulating spacers 13 and the extrinsic space 5 has been formed, the surface is covered with a layer of metal 14 (e.g. titanium) to form a selected silicide on the zones of silicon 12 and of base polysilicon 5.

FIGS. 3A and 3B show a second variant embodiment of a novel collector in accordance with the invention. The various characteristic zones that are identical to those shown in FIGS. 2A and 2B are given identical references. In this variant, trenches 15 are formed by conventional etching and masking techniques after the zones 2 and 3 have been formed and crossing right through the insulating zones 2 to open out into the retrograde well 3. The trenches 15 thus advantageously open out at the well in the most highly doped zoned of the well. Thereafter an N+ type dopant is implanted over the trenches and into the well 3 in order to form the collector contact zone 11. A layer of polysilicon 12 is then deposited to fill the trenches and provide contact with the collector contact zone 11. The layer 12 is covered by a layer 14 whose nature and conditions of implementation depend on the techniques used, i.e. polycide (FIG. 3A) or salicide (FIG. 3B) as described respectively with reference to FIGS. 2A and 2B.

In this second embodiment, the collector contact is established directly in the zone of high doping or of maximum doping in the retrograde well and situated level with or beneath the insulating zones 2. The collector contact is thus greatly improved by the use of such trenches. The collector resistance can be improved by a factor of about ten by using such a technique.

It thus appears that implementing at least one collector contact zone 11 extending away from the base zone 4, no further than level with an insulating zone 2 makes it possible to eliminate the resistance that appears in the prior art transistor (FIG. 1) between the zone 11 and vertically below the insulating zone 2.

The bipolar transistor including the improvement relating tot he provision of its collector contact is particularly adapted to making circuits of the BI-MOS or of the BI-CMOS types.

The collector improvement of the invention is described above with reference to a bipolar transistor made using the technique described in the patent application referred to above. Naturally, such and improvement may be implemented in other types of bipolar transistors made of technology that is compatible with MOS. In this respect, such an improvement may be used for a different base and emitter configuration. In addition, only one collector contact C need be made.

The invention is not limited to the examples described and shown, and numerous modifications can be applied thereto without going beyond the ambit of the invention.

We claim:

1. A bipolar transistor comprising a semiconductor substrate, of a first conductivity type, a retrograde well serving as the collector and having a second conductivity type opposite to the first, a base active region having the first conductivity type, a region serving as an emitter of the second conductivity type, the base active and emitter regions being bordered by insulating regions;

wherein the transistor includes at least one second conductivity type zone serving as a collector contact, said second conductivity type zone being located in a highly doped region of the retrograde will and spaced from the base zone, said collector contact being substantially level with an insulated zone and connected with a trench crossing through the insulating zone, the trench being filled with a layer of polysilicon.

2. A transistor according to claim 1, wherein said second conductivity zone is made by implanting a dopant in the retrograde well such that the collector is formed at or below a level of the insulating zones.

3. A transistor according to claim 1, made by a method comprising the steps of forming a complex silicide containing on the substrate by depositing a layer of polysilicon which is covered by a layer of silicide or of metal subsequently subjected to amealing, and removing the coating by masking and photo-etching (1) in an emitter contact region to form an active emitter region made level with the base active region and obtained by diffusion, and (2)in regions extending over the insulating zones and the zones alone the edges of said insulating zones beside the base regions.

4. A transistor according to claim 1, made by a method comprising the step of depositing on the face of the substrate a layer of polysilicon, which layer is subsequently removed by masking and photoetching with the exception of the emitter active region and of the collector contact zones.

* * * * *